(12) United States Patent
Makino

(45) Date of Patent: Dec. 1, 2009
(10) Patent No.: US 7,627,012 B2

(54) DISTRIBUTED FEEDBACK SEMICONDUCTOR LASER INCLUDING WAVELENGTH MONITORING SECTION

(75) Inventor: Toshihiko Makino, Irvine, CA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 100 days.

(21) Appl. No.: 12/119,607

(22) Filed: May 13, 2008

(65) Prior Publication Data

US 2008/0212637 A1   Sep. 4, 2008

Related U.S. Application Data

(63) Continuation-in-part of application No. 11/280,517, filed on Aug. 24, 2005, now Pat. No. 7,583,719.

(51) Int. Cl.
*H01S 5/00* (2006.01)

(52) U.S. Cl. ................ 372/50.11; 372/43.01; 372/50.1; 372/50.21

(58) Field of Classification Search ............. 372/50.11, 372/43.01, 50.1
See application file for complete search history.

(56) References Cited

U.S. PATENT DOCUMENTS 6,577,660 B1 * 6/2003 Muroya .................... 372/50.11
2006/0088066 A1 * 4/2006 He ............................ 372/10

* cited by examiner

*Primary Examiner*—Dung T Nguyen
(74) *Attorney, Agent, or Firm*—Norman Stephan Kinsella; Grossman, Tucker, Perrault & Pfleger PLLC

(57) ABSTRACT

In general, a complex-coupled distributed feedback (DFB) semiconductor laser includes a grating formed by grooves through at least a part of an active region of a laser cavity. The complex-coupled DFB laser may be configured with a wavelength monitoring section and may be configured to provide facet power asymmetry. The wavelength monitoring section may include a second-order grating section configured to emit radiation (e.g., vertical radiation) from a side of the DFB laser for monitoring.

25 Claims, 3 Drawing Sheets

DISTRIBUTED FEEDBACK SEMICONDUCTOR LASER INCLUDING WAVELENGTH MONITORING SECTION

CROSS-REFERENCE TO RELATED APPLICATIONS

This application is a continuation-in-part of U.S. patent application Ser. No. 11/280,517, filed on Aug. 24, 2005 and is related to U.S. patent application Ser. No. 12/119,586 filed concurrently herewith, both of which are fully incorporated herein by reference.

TECHNICAL FIELD

The present invention relates to distributed feedback (DFB) lasers and in particular, to DFB semiconductor lasers including a wavelength monitoring section.

BACKGROUND INFORMATION

Semiconductor lasers may be used in a variety of industrial and scientific applications, such as optical communications. Optical communications applications, for example, may employ lasers that emit light at a particular lasing wavelength (e.g., 1.31 µm or 1.55 µm) suitable for transmission through optical fibers. Semiconductor lasers may be desirable over other types of lasers because they have a relatively small volume and consume a relatively small amount of power.

Lasers generally include a laser cavity defined by mirrors or reflectors and an optical gain medium between the reflectors in the laser cavity. When pumped with pumping energy (e.g., an electrical current), the gain medium amplifies electromagnetic waves (e.g., light) in the cavity by stimulated emission, thereby providing optical gain and generating a laser light output. In semiconductor lasers, a semiconductor active layer or region serves as the gain medium and reflectors provide optical feedback for laser oscillation within the active region. In Fabry-Perot lasers, for example, a set of mirrors or cleaved facets bound the active region to provide the optical feedback. In other semiconductor lasers, such as distributed feedback (DFB) lasers and distributed Bragg reflector (DBR) lasers, one or more diffraction gratings (e.g., Bragg gratings) may be used to provide reflectance. In a DFB laser, for example, a distributed reflector (e.g., a diffraction grating or Bragg grating) along the active region provides the optical feedback and may be used to restrict oscillation to a single mode.

Fiber optic communication systems may require a high performance light source capable of generating single-mode, narrow spectral linewidth emission in the 1.3-1.56 µm wavelength range. Some of the existing semiconductor lasers (e.g., InGaAsP DFB lasers) fail to provide stable single-mode operation that is insensitive to ambient temperature change (uncooled operation) and insensitive to external optical feedback (isolator-less operation) and fail to provide high single-mode yield and high output power. Complex-coupled DFB lasers have been developed that provide advantages such as high single-mode yield, less sensitivity to external optical feedback, high modulation bandwidth and reduced wavelength chirp. Complex-coupled DFB lasers generally provide both index coupling and gain coupling. Certain complex-coupled DFB lasers will predominantly lase on the longer wavelength side of the Bragg stop band (this lasing mode is referred to as the long Bragg mode hereafter). In complex-coupled DFB lasers with periodically etched MQW's, however, there are still fundamental problems such as variations of the complex coupling coefficient due to variations of grating etching depth, laser performance variations due to random variations of facet grating phase, and variations in lasing wavelength due to the ratio of index to gain coupling.

Semiconductor lasers may be designed to provide wavelength monitoring. In some semiconductor lasers, for example, wavelength monitoring may be performed out of a back facet of the laser. Such wavelength monitoring out of the back facet, however, requires cleaving of the laser. Thus, wavelength monitoring may not be performed during wafer testing before the lasers are cleaved.

BRIEF DESCRIPTION OF THE DRAWINGS

These and other features and advantages will be better understood by reading the following detailed description, taken together with the drawings wherein.

DETAILED DESCRIPTION

In general, a distributed feedback (DFB) semiconductor laser includes a grating formed by grooves through at least a part of an active region of a laser cavity. The DFB laser may be configured with a wavelength monitoring section and may be configured to provide facet power asymmetry. As will be described in greater detail below, the wavelength monitoring section may include a second-order grating section configured to emit radiation (e.g., vertical radiation) from a side of the DFB laser for monitoring. In an embodiment, the DFB laser may also have a complex coupling coefficient.

Figure 1:
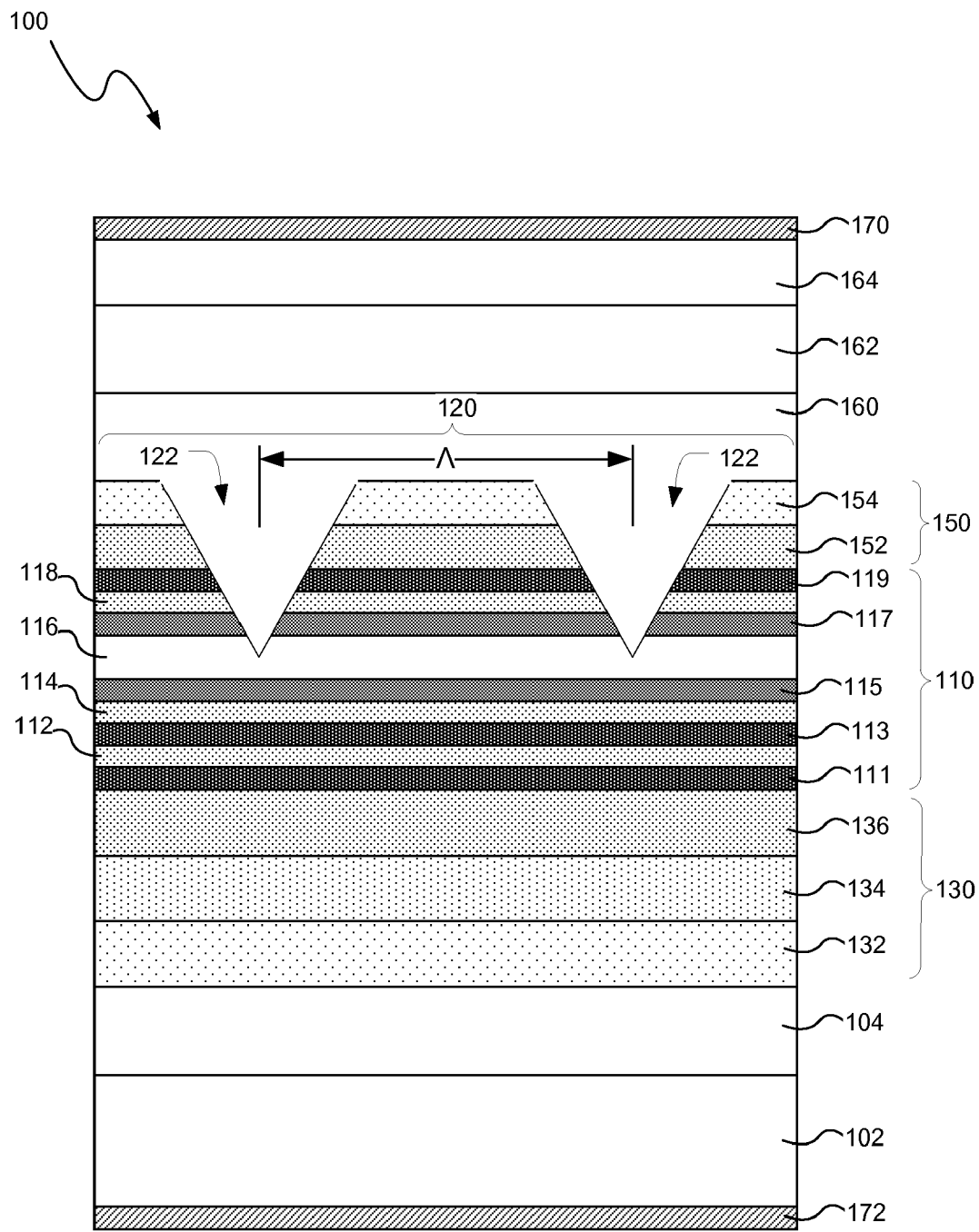
FIG. 1 is a cross-sectional view of a portion of a DFB laser, consistent with an embodiment.

Referring to FIG. 1, a DFB laser device 100 with a wavelength monitoring section, consistent with an embodiment, is described in greater detail. The DFB laser device 100 includes an active region 110 with periodic variation of thickness to form a grating 120. The active region 110 may include quantum-well (QW) layers 111, 113, 115, 117, 119 and barrier layers 112, 114, 116, 118. The grating 120 is formed by grooves 122 extending at least partially through the active region 110, for example, through some of the QW layers 117, 119 and into one of the barrier layers 116. The grooves 122 may be spaced along at least a portion of the active region 110 (only a section of the DFB laser device 100 is shown in FIG. 1).

The laser device 100 may also include a semiconductor substrate 102 (e.g., an N-type InP substrate) on which is grown a buffer layer 104 (e.g., 1.5 µm thick layer of N-type InP). A first confinement region 130 may be provided over the buffer layer 104. The first confinement region may include three confinement layers 132, 134, and 136, for example, of N-type InGaAsP with band gap energies corresponding to wavelengths of 1.0 µm, 1.05 µm, and 1.1 µm, respectively. The thickness of each of the confinement layers 132, 134, 136 may be about 20 nm.

The active region 110 overlies the confinement region 130 and may include five QW layers 111, 113, 115, 117, 119 and four barrier layers 112, 114, 116, 118. The barrier layers 112, 114, 118 may be made of InGaAsP composition with a band gap energy corresponding to a wavelength of 1.1 μm and may each be about 10 nm thick. The QW layers 111, 113, 119 may be made of InGaAsP composition and may be tailored so as to provide a first transition energy of the QW, corresponding to a wavelength of 1.31 μm. The barrier layer 116 may be made of InP with the layer being 10~20 nm thick. The QW layers 115 and 117 may be made of InGaAsP composition and may be tailored so as to provide a first transition energy of the QW, corresponding to a wavelength of 1.31 μm. The QW transition energy may be determined by a combination of the QW alloy composition (e.g., having a PL peak wavelength of around 1.3 μm), strain (e.g., compressive strain of 1%), thickness (e.g., 6~7 nm), and the band gap energy of their adjacent barrier layers (e.g., a band gap energy corresponding to a wavelength of 1.1 μm).

A second confinement region 150 may be provided on top of the active region 110. The second confinement region 150 may include two confinement layers 152, 154 of InGaAsP with band gap energies corresponding to wavelengths of 1.1 μm, and 1.0 μm, respectively, and each with a layer thickness of about 20 nm.

The grating 120 may be defined by periodically etching the grooves 122, for example, through the QW layers 117, 119 and stopping in the barrier layer 116. The grating 120 may be a Bragg grating in which a grating period or pitch Λ of the grating is related to the Bragg wavelength $\lambda_B$ as follows:

$$\lambda_{B,q} = 2n_e \Lambda / q$$

where $n_e$ is the effective index of refraction and q is an integer (q=1, 2, . . . ). The pitch Λ of the grooves of the grating 120 may be selected so as to define an order of the grating, as will be described in greater detail below. A fill layer 160 having substantially the same band gap energy as the barrier layer 116 may fill the grooves 122 of the grating 120. The fill layer 160 may be a P-type InP material grown to fill the grooves and to make a layer of 0.2 μm thickness on top of the confinement layer 154.

An upper cladding layer 162 may be provided on the fill layer 160 followed by a highly doped P-type capping layer 164 for contact enhancement. The upper cladding layer 162 may be a layer of P-type InP having a thickness of 1.3~1.6 μm and the capping layer 164 may be a layer of InGaAs having a thickness 200 nm. The laser device 100 may also include top electrode 170 and bottom electrode 172 for current injection into the laser device 100.

In operation, the wavelength corresponding to a transition between the first quantized levels of conduction and valance bands of a QW with symmetric barriers is given by the following equation:

$$\lambda(\mu m) = \frac{1.24}{E_g + E_c + E_v} \quad (1)$$

where $E_g$ is the band gap energy of the QW (in unit eV), and $E_c$ and $E_v$ are the quantized energy levels in the conduction and valence bands, respectively (in unit eV). $E_c$ can be approximated as $$E_c = \left[\frac{\pi}{2} \frac{a_c}{W + \Delta W_c}\right]^2 \quad (2)$$

where $$\Delta W_c = \frac{a_c}{\sqrt{b_c \Delta E_c}} \quad (3)$$

$$a_c = \frac{2\hbar}{\sqrt{2m_{cw}}} \quad (4)$$

$$b_c = \frac{m_{cw}}{m_{cb}} \quad (5)$$

$\Delta E_c$ is the discontinuity of the band edge of the conduction band, h is Planck's constant divided by 2π, W is the QW width, and $m_{cw}$ and $m_{cb}$ are the effective masses of electrons inside the well, and the barrier, respectively. The quantized energy $E_v$ for the valance band can be expressed by equation (2) replacing subscript "c" with a subscript "v". It can be seen from equation (2) that the larger $\Delta E_c$ ($\Delta E_v$) gives larger $E_c$ ($E_v$), which in turn gives shorter first transition wavelength λ in equation (1). Thus, the barrier having larger band gap energy has a shorter first transition wavelength for a given QW.

According to the exemplary embodiment, the QW layers 111, 113, 119 may include, for example, a lattice matched quaternary (Q) InGaAsP QW layer of band gap energy of 0.886 eV and thickness 65 nm and with a corresponding wavelength of 1.4 μm (also referred to as a 1.4 Q). The QW layers 111, 113, 119 may have symmetric 1.1 Q barrier layers 112, 114, 118, and, in this example, the first transition wavelength of this symmetric QW structure is calculated to be 1.313 μm. The other two QW layers 115, 117 may have asymmetric barrier layers, for example, 1.1 Q barrier layers 114, 118 and barrier layer 116 of InP with a band gap energy of 1.35 eV. The first transition wavelength of this asymmetric QW structure is calculated numerically to be 1.300 μm. For comparison, the first transition wavelength of a symmetric QW structure with symmetric InP is calculated by the equations above to be 1.279 μm. Therefore, the first transition wavelength (1.300 μm) of the asymmetric QW structure with 1.1 Q and InP barriers is between those of the symmetric QW structures with 1.1 Q and InP barriers (i.e., between the wavelengths 1.313 μm and 1.279 μm, respectively). Thus, the first transition wavelength of a QW may be made shorter by using a barrier layer of larger band gap energy. The symmetric and asymmetric quantum-well structures may provide the same gain peak wavelength in order to have a sufficient modal gain for lasing. The first transition wavelength of the two asymmetric QW structures can be increased from 1.300 μm to 1.313 μm by increasing the QW thickness slightly. In this way, the two types of quantum-well structures may be tailored to provide almost same gain peak wavelengths.

A DFB laser device with a wavelength monitoring section, consistent with embodiments described herein, may also have other configurations and layers and may have other grating structures. In particular, other numbers and types of QW layers and barrier layers may be used. Also, although a triangular or trapezoidal shape is shown for the grating, other shapes may also be used such as square or sinusoidal.

Figure 2:
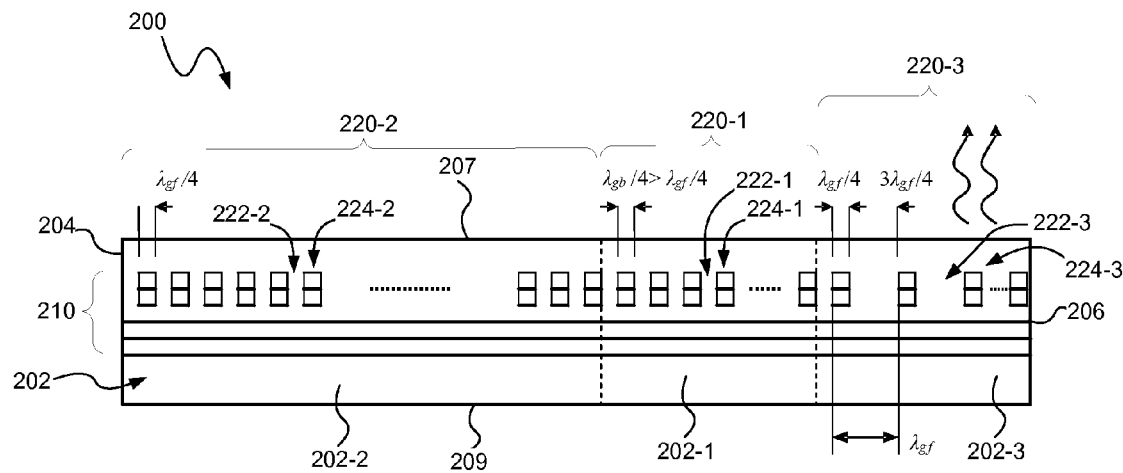
FIG. 2 is a diagrammatic side view of a complex-coupled DFB laser including a wavelength monitoring section, consistent with an embodiment.

FIG. 2 shows a complex-coupled DFB laser device 200, consistent with an embodiment, configured to provide wavelength monitoring and facet power asymmetry. The complex-coupled DFB laser device 200 includes a laser cavity 202 extending between front and back facets 204, 206 and first and second sides 207, 209. The laser cavity 202 may include first and second main cavity sections 202-1, 202-2 with first and second complex-coupled grating sections 220-1, 220-2, respectively, having different Bragg wavelengths (i.e., $\lambda_{gb}$, $\lambda_{gf}$). In the exemplary embodiment, the laser cavity sections 202-1, 202-2 are located in the back and front of the laser device 200, respectively, such that the back laser cavity section 202-1 includes the first grating section 220-1 and the front laser cavity section 202-2 includes the second grating section 220-2.

The laser cavity 202 further includes a third or wavelength monitoring cavity section 202-3 with a second order grating section 220-3, which may have a Bragg wavelength ($\lambda_{gf}$) of the second grating section 220-2 in the second or front cavity section 202-2. The second order grating section 220-3 in the wavelength monitoring cavity section 202-3 is configured to emit radiation (e.g., vertical radiation) from the first side 207 of the DFB laser device 200. The vertical radiation may be at the same wavelength as the lasing wavelength and used for monitoring the wavelength of the DFB laser device 200.

In this embodiment, the first and second grating sections 220-1, 220-2 are first-order gratings and generally have a grating period or pitch of one-half wavelength (i.e., $\lambda_{gb}/2$ and $\lambda_{gf}/2$ respectively), whereas the second-order grating section 220-3 has a grating period or pitch of one wavelength ($\lambda_{gf}$). In other embodiments, the laser 200 may include additional laser cavity sections with additional grating sections. The grating sections 220-1, 220-2, 220-3 may be formed with different grating periods, for example, by electron beam writing and changing the grating pitch along the cavity length.

In the exemplary embodiment, the lengths of the laser cavity sections 202-1, 202-2 may be selected such that the second grating section 220-2 (e.g., in the second or front main cavity section 202-2) is longer and provides the main feedback mechanism for lasing. The first grating section 220-1 (e.g., in the first or back main cavity section 202-1) is shorter and acts as a reflector for the lasing wavelength. The Bragg wavelength $\lambda_{gb}$ of the first or back grating section 220-1 may be greater than the Bragg wavelength $\lambda_{gf}$ of the second or front grating section 220-2. The Bragg wavelength $\lambda_{gb}$ may be, for example, about 1~2 nm greater than the Bragg wavelength $\lambda_{gf}$. Because of complex coupling in this embodiment, the lasing mode is obtained at the longer wavelength side of the Bragg stop band of the front grating section 220-2. The front and back facets 204, 206 may be AR (antireflection) coated to eliminate facet reflections.

The grating sections 220-1, 220-2, 220-3 may be formed in an active region 210 of the laser cavity 202, for example, as described above and shown in FIG. 1. The grating sections 220-1, 220-2, 220-3 thus each include alternating low corrugation regions 222-1, 222-2, 222-3 and high corrugation regions 224-1, 224-2, 224-3. The duty cycle of the grating sections may be equal to the ratio of the length of the low corrugation regions to the length of the high corrugation regions. In the exemplary embodiment shown in FIG. 2, the duty cycle of the first and second grating sections 220-1, 220-2 is about 50%. The length of the high and low corrugation sections 222-1, 224-1 in the first grating section is about $\lambda_{gb}/4$ and the length of the high and low corrugations sections 222-2, 224-2 in the second grating section 220-2 is about $\lambda_{gf}/4$, where $\lambda_{gb}/4 > \lambda_{gf}/4$. As used herein, the term "about" allows a variation within acceptable tolerances.

The duty cycle of the second-order grating section 220-3 is about 25%, which provides a higher vertical radiation component. In the second-order grating section 220-3, the length of the high corrugation sections 222-3 is about $\lambda_{gf}/4$ and the length of the low corrugation sections 224-3 is about $3\lambda_{gf}/4$.

The second-order grating section 220-3 in the wavelength monitoring section 202-3 may also have other duty cycles capable of providing sufficient radiation from the first side 207 for monitoring the wavelength.

The low corrugation regions 222-1, 222-2, 222-3 and the high corrugation regions 224-1, 224-2, 224-3 provide alternating regions with complex indices, $N_L$ and $N_H$, respectively, which are a function of the QWs in the corrugation region. The complex indices, $N_L$ and $N_H$, may be expressed as follows:

$$N_s = n_s + jm_s \tag{6}$$

where $n_s$ and $m_s$ are the real part and imaginary part of the complex index for the section s (s=H or L) and $m_s$ can be expressed as $$m_s = [\Gamma_s g_s - (1-\Gamma_s)\alpha_s]/(2k) \tag{7}$$

where $\Gamma_s$ is the optical confinement factor for the active QW, $g_s$ is the material gain in the QW, $\alpha_s$ is the absorption loss in other layer, and k is the vacuum wavenumber. In the exemplary embodiment, the refractive index $n_H$ of the high corrugation regions 224-1, 224-2, 224-3 is larger than the refractive index $n_L$ of the low corrugation regions 222-1, 222-2, 222-3 because the high corrugation regions have more quaternary materials which have a higher refractive index. In the exemplary embodiment, the optical confinement factor $\Gamma_H$ of the high corrugation regions 224-1, 224-2, 224-3 is larger than the optical confinement factor $\Gamma_L$ of the low corrugation regions 222-1, 222-2, 222-3 because the high corrugation region has a larger number of QWs and $\Gamma_s$ is roughly proportional to the number of QWs. The absorption loss $\alpha_s$ is also usually smaller than the material gain $g_s$ resulting in $m_H > m_L$.

In general, the difference in the real parts $n_H$ and $n_L$ may provide index coupling and the difference in the imaginary parts $m_H$ and $m_L$ may provide gain coupling. There are two dominant modes at both edges of the Bragg stop band (the long Bragg mode and the short Bragg mode) for index-coupled DFB lasers with no facet reflections. The field of the long Bragg mode is mainly confined in the high corrugation region, while the field of the short Bragg mode is mainly confined in the low corrugation region. If the high index region has a higher gain ($m_H > m_L$ in equation (7)) (in-phase complex coupling), the long Bragg mode experiences a higher gain than the short Bragg mode. Therefore, the long Bragg mode becomes the main mode, and the short Bragg mode is suppressed. On the contrary, if the high index region has a lower gain (anti-phase complex coupling), the short Bragg mode becomes the main mode. In the exemplary embodiment of FIG. 2, the high corrugation region has higher $n_H$ and $n_L$. Therefore, the structure has in-phase complex coupling, which provides high single-mode stability.

Since the main mode is determined mainly by the front cavity section 202-2 (which is chosen to be 70~80% of the total length of the main cavity sections), the mode wavelength is located at the longer wavelength side of the Bragg stop band of second grating section 220-2 in the front main cavity section 202-2. In this embodiment, the lasing mode is obtained at the longer wavelength side of the Bragg stop band of the second grating section 220-1 due to in-phase complex coupling. The lasing wavelength is given approximately by the $\lambda_{gf} + \Delta\lambda_{gf}/2$ where $\Delta\lambda_{gf}$ is the width of the Bragg stop band of the second grating section 220-2 in the front main cavity section 202-2. Therefore, if $\lambda_{gb}$ is chosen such that $\lambda_{gb} \approx \lambda_{gf} + \Delta\lambda_{gf}/2$, the lasing wavelength is made to match $\lambda_{gb}$ at which the first grating section 220-1 in the back main cavity section 202-1 has a maximum reflection. In this way, an asymmetric power distribution in the laser cavity is produced, making the front facet power higher than the back facet power, which reduces or eliminates the random effect of facet grating phase.

Figure 3:
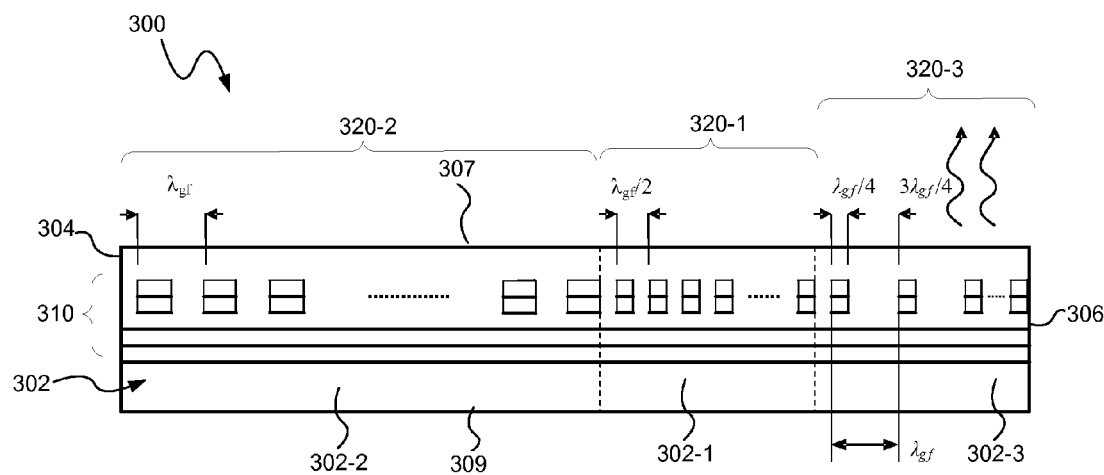
FIG. 3 is a diagrammatic side view of a gain-coupled DFB laser including a wavelength monitoring section, consistent with another embodiment.

FIG. 3 shows a gain coupled DFB laser 300 that provides wavelength monitoring, consistent with another embodiment. The gain coupled DFB laser 300 includes a laser cavity 302 extending between front and back facets 304, 306 and first and second sides 307, 309. The laser cavity 302 may include first and second main cavity sections 302-1, 302-2 with first-order and second-order grating sections 320-1, 320-2, respectively. The gain coupled DFB laser 300 also includes a third or wavelength cavity section 302-3 with a second-order grating section 320-3 that emits radiation from the first side 307 for wavelength monitoring, as described above. The grating sections 320-1, 320-2, 320-3 may be formed in an active region 310 of the laser cavity 302, for example, as described above and shown in FIG. 1.

In the exemplary embodiment, the main cavity sections 302-1, 302-2 are located in the back and front of the laser device 300, respectively, such that the back main cavity section 302-1 includes the first-order grating section 320-1 and the front main cavity section 302-2 includes the second-order grating section 320-2. The first-order grating section 320-1 generally has a grating period or pitch of one-half wavelength ($\lambda_{gf}/2$), whereas the second-order grating section 320-2 has a grating period or pitch of one wavelength ($\lambda_{gf}$). In other embodiments, the laser 300 may include additional laser cavity sections with additional grating sections. One example of a gain coupled DFB laser with a second-order grating used as the main feedback mechanism is described in greater detail in U.S. patent application Ser. No. 12/119,586, which is commonly owned and filed concurrently herewith.

In the exemplary embodiment shown in FIG. 3, the second-order grating section 320-2 has a duty cycle of substantially 50%, which causes the index coupling coefficient to become substantially zero and substantially eliminates the vertical radiation component in the second-order grating section 320-2. Thus, the index coupling provided by the quantum well etching in the second-order grating section 320-2 does not contribute to feedback in the grating direction and only gain coupling is provided by the modulation of quantum well numbers. The resulting substantially pure gain coupling gives a single mode oscillation at the Bragg wavelength $\lambda_{gf}$ of the second-order grating section 320-2, which may improve wavelength accuracy.

Figure 4:
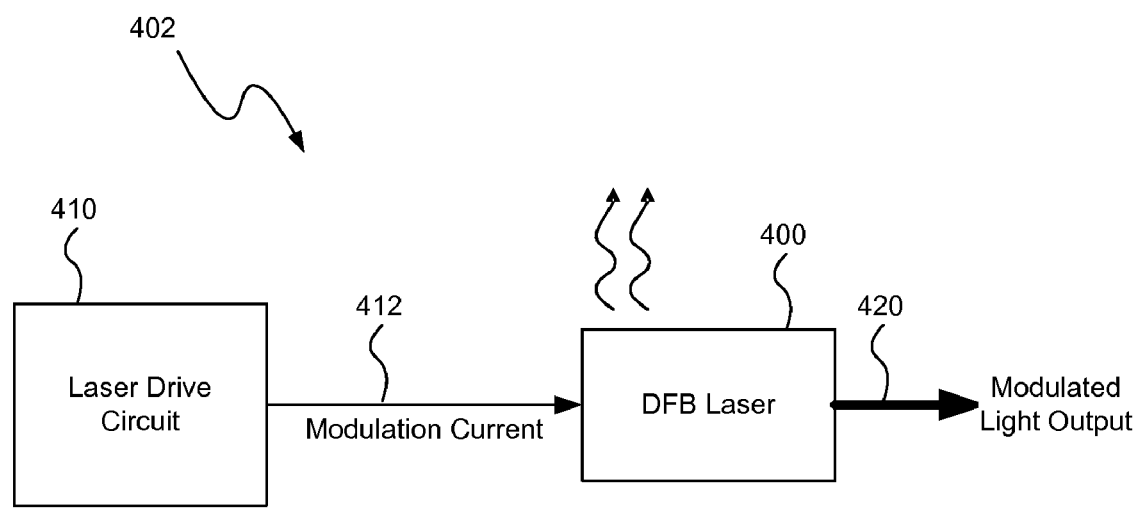
FIG. 4 is a schematic functional block diagram of a laser transmitter including a directly-modulated DFB laser with a wavelength monitoring section, consistent with embodiments of the present disclosure.

Referring to FIG. 4, a DFB laser 400 including a monitoring section, according to any of the embodiments described above, may be used in a laser transmitter 402 including a laser drive circuit 410. The complex coupled DFB laser 400 may be electrically coupled to the laser drive circuit 410 and optically coupled to an optical waveguide (not shown) such as an optical fiber. One example of the laser transmitter 402 is a laser transmitter designed for optical fiber communication applications, such as the type available from Applied Optoelectronics, Inc. for use in CATV communications. In such "broadband" applications, the laser transmitter 402 and particularly the DFB laser 400 may be designed for high bit rate operation, for example, up to about 10 Gb/s and the DFB laser 400 may be configured for operation at wavelengths such as 1310 nm and 1550 nm. This example of the laser transmitter 402 may also include other components, such as an RF amplifier, a thermoelectric cooler (TEC) controller, a microcontroller, a predistortion circuit, and/or a clipping correction circuit, as well as other components known to those skilled in the art for use in a laser transmitter. Embodiments of the DFB laser with wavelength monitoring may also be used in other types of laser transmitters used in other communications applications or in other non-communications applications, such as chemical sensing.

The laser drive circuit 410 may include circuitry known to those skilled in the art for providing at least a modulation current 412 to the DFB laser 400. The laser drive circuit 410 may also provide other currents to the DFB laser 400 such as a laser threshold current and/or a bias current. The DFB laser 400 receives the modulation current 412 and generates a modulated light output 420 in response to the modulation current 412. Thus, the modulation of the light occurs within the cavity of the DFB laser 400 in this embodiment. When providing direct modulation in the laser transmitter 302, a more stable single-mode operation and improved single-mode yield and output power may be achieved by using the DFB laser 400 and the wavelength may be more easily monitored using the wavelength monitoring section.

Accordingly, embodiments of the DFB laser with wavelength monitoring facilitate wavelength monitoring while also improving single-mode stability, reducing the effects of facet grating phase, and/or improving wavelength accuracy. Consistent with one embodiment, a distributed feedback (DFB) semiconductor laser device includes a laser cavity extending from a front facet to a rear facet and between first and second sides. The laser cavity includes at least first and second main cavity sections and a wavelength monitoring section. The DFB laser may also include an active region located in the laser cavity. The active region includes a plurality of quantum-well layers and barrier layers between the quantum-well layers. The bandgap energy of the barrier layers is greater than the bandgap energy of the quantum-well layers. The DFB laser further includes a grating formed by grooves extending at least partially through the active region and spaced along at least a portion of the laser cavity. The grating includes first and second grating sections in the first and second main cavity sections, respectively, and a second-order grating section in the wavelength monitoring section of the cavity. The second grating section is longer than the first grating section and provides a main feedback mechanism for lasing. The first grating section is configured to reflect the lasing wavelength such that laser radiation is emitted from the front facet. The second-order grating section in the wavelength monitoring section is configured to emit laser radiation from the first side.

Consistent with another embodiment, a laser transmitter includes a laser drive circuit configured to provide at least a modulation current and a directly modulated distributed feedback semiconductor laser configured to receive the modulation current and configured to generate a modulated light output in response to the modulation current. The directly modulated distributed feedback semiconductor laser includes a laser cavity extending from a front facet to a rear facet and between first and second sides. The laser cavity includes at least first and second main cavity sections and a wavelength monitoring section. The DFB laser may also include an active region located in the laser cavity. The active region includes a plurality of quantum-well layers and barrier layers between the quantum-well layers. The bandgap energy of the barrier layers is greater than the bandgap energy of the quantum-well layers. The DFB laser further includes a grating formed by grooves extending at least partially through the active region and spaced along at least a portion of the laser cavity. The grating includes first and second grating sections in the first and second main cavity sections, respectively, and a second-order grating section in the wavelength monitoring section of the cavity. The second grating section is longer than the first grating section and provides a main feedback mechanism for lasing. The first grating section is configured to reflect the lasing wavelength such that laser radiation is emitted from the front facet. The second-order grating section in the wavelength monitoring section is configured to emit laser radiation from the first side.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A distributed feedback (DFB) semiconductor laser device, comprising:
   a laser cavity extending from a front facet to a rear facet and between first and second sides, the laser cavity including at least first and second main cavity sections and a wavelength monitoring section;
   an active region located in the laser cavity, the active region comprising a plurality of quantum-well layers and barrier layers between the quantum-well layers, the bandgap energy of the barrier layers being greater than the bandgap energy of the quantum-well layers; and
   a grating formed by grooves extending at least partially through the active region and spaced along at least a portion of the laser cavity, wherein the grating comprises first and second grating sections in the first and second main cavity sections, respectively, and a second-order grating section in the wavelength monitoring section of the cavity, wherein the second grating section is longer than the first grating section and provides a main feedback mechanism for lasing, wherein the first grating section is configured to reflect the lasing wavelength such that laser radiation is emitted from the front facet, and wherein the second-order grating section in the wavelength monitoring section is configured to emit laser radiation from the first side.

2. The laser device of claim 1 wherein the grating includes alternating high and low corrugation sections of different effective refractive indices, and wherein the corrugation sections of the first grating section have a length that is greater than a length of the corrugation sections of the second grating section.

3. The laser device of claim 1 wherein a Bragg wavelength of the first grating section is greater than a Bragg wavelength of the second grating section.

4. The laser device of claim 1 wherein a Bragg wavelength of the second-order grating section in the wavelength monitoring section is the same as a Bragg wavelength of the second cavity section in the first main cavity section.

5. The laser device of claim 1 wherein the first and second main cavity sections are back and front cavity sections.

6. The laser device of claim 1 wherein the second-order grating in the wavelength monitoring section has a duty cycle of about 25%.

7. The laser device of claim 1 wherein the grating includes alternating high and low corrugation sections of different effective refractive indices, and wherein a grating period of the second-order grating in the wavelength monitoring section is twice a grating period of the first grating section in the first cavity section, and wherein a length of the high corrugation sections in the second-order grating section are about the same as a length of the high corrugation sections in the first grating section.

8. The laser device of claim 1 wherein the first grating section is a first-order grating section, and wherein the second grating section is a second-order grating section.

9. The laser device of claim 1 wherein the first and second grating sections are first-order grating sections.

10. The laser device of claim 1 wherein the grating is configured to provide a complex coupling coefficient.

11. The laser device of claim 1 wherein the grooves extend into at least one of the barrier layers, and wherein the grooves are filled with a fill layer, the at least one of the barrier layers and the fill layer being made of semiconductor materials having substantially the same bandgap energy.

12. The laser device of claim 1 wherein the active region comprises:
   a plurality of quantum-well layers of bandgap energy $E_{q1}$ adjoined with barrier layers of bandgap energy $E_{b1}$ wherein $E_{b1} > E_{q1}$; and
   two quantum-well layers of bandgap energy $E_{q2}$ adjoined with a barrier layer of bandgap energy $E_{b2}$ in between the two quantum-well layers and adjoined with two outside barrier layers of bandgap energy $E_{b1}$, wherein $E_{b2} > E_{b1} > E_{q1} \geq E_{q2}$.

13. The laser device of claim 12 wherein the grooves extend into the barrier layer of bandgap energy $E_{b2}$, and wherein the grooves are filled with a fill layer, the barrier layer of bandgap energy $E_{b2}$ and the fill layer being made of semiconductor materials having substantially the same bandgap energy.

14. The laser device of claim 13 wherein the fill layer and the barrier layer of bandgap energy $E_{b2}$ are made of InP material.

15. The laser device of claim 12 wherein the quantum-well layers of bandgap energy $E_{q1}$ are InGaAsP.

16. The laser device of claim 12 wherein the quantum-well layers of bandgap energy $E_{q2}$ are InGaAsP.

17. The laser device of claim 12 wherein the barrier layers of bandgap energy $E_{b1}$ are InGaAsP.

18. A laser transmitter comprising:
   a laser drive circuit configured to provide at least a modulation current; and
   a directly modulated distributed feedback semiconductor laser configured to receive the modulation current and configured to generate a modulated light output in response to the modulation current, the directly modulated distributed feedback semiconductor laser comprising:
      a laser cavity extending from a front facet to a rear facet and between first and second sides, the laser cavity including at least first and second main cavity sections and a wavelength monitoring section;
      an active region located in the laser cavity, the active region comprising a plurality of quantum-well layers and barrier layers between the quantum-well layers, the bandgap energy of the barrier layers being greater than the bandgap energy of the quantum-well layers; and
      a grating formed by grooves extending at least partially through the active region and spaced along at least a portion of the laser cavity, wherein the grating comprises first and second grating sections in the first and second main cavity sections, respectively, and a second-order grating section in the wavelength monitoring section of the cavity, wherein the second grating section is longer than the first grating section and provides a main feedback mechanism for lasing, wherein the first grating section is configured to reflect the lasing wavelength such that laser radiation is emitted from the front facet, and wherein the second-order grating section in the wavelength monitoring section is configured to emit laser radiation from the first side.

19. The laser transmitter of claim 18 wherein the first and second cavity sections are back and front cavity sections.

20. The laser transmitter of claim 18 wherein the grating is configured to provide a complex coupling coefficient.

21. The laser transmitter of claim 18 wherein the grooves extend into at least one of the barrier layers, and wherein the grooves are filled with a fill layer, the at least one of the barrier layers and the fill layer being made of semiconductor materials having substantially the same bandgap energy.

22. The laser transmitter of claim 18 wherein the second-order grating in the wavelength monitoring section has a duty cycle of about 25%.

23. The laser transmitter of claim 18 wherein a Bragg wavelength of the first grating section is greater than a Bragg wavelength of the second grating section.

24. The laser transmitter of claim 18 wherein the first grating section is a first-order grating section, and wherein the second grating section is a second-order grating section.

25. The laser transmitter of claim 18 wherein the first and second grating sections are first-order grating sections.

\* \* \* \* \*